US009230656B2

(12) United States Patent
Avila et al.

(10) Patent No.: US 9,230,656 B2
(45) Date of Patent: Jan. 5, 2016

(54) SYSTEM FOR MAINTAINING BACK GATE THRESHOLD VOLTAGE IN THREE DIMENSIONAL NAND MEMORY

(71) Applicant: SanDisk Technologies Inc., Plano, TX (US)

(72) Inventors: Chris Nga Yee Avila, Saratoga, CA (US); Gautam Ashok Dusija, Milpitas, CA (US); Yingda Dong, San Jose, CA (US); Jian Chen, Menlo Park, CA (US); Man Lung Mui, Fremont, CA (US); Alexander Kwok-Tung Mak, Los Altos Hills, CA (US); Seungpil Lee, San Ramon, CA (US)

(73) Assignee: SanDisk Technologies Inc., Plano, TX (US)

( * ) Notice: Subject to any disclaimer, the term of this patent is extended or adjusted under 35 U.S.C. 154(b) by 239 days.

(21) Appl. No.: 13/927,659

(22) Filed: Jun. 26, 2013

(65) Prior Publication Data
US 2015/0003161 A1    Jan. 1, 2015

(51) Int. Cl.
*G11C 16/10*    (2006.01)
*G11C 16/04*    (2006.01)
*G11C 16/34*    (2006.01)
*G11C 29/02*    (2006.01)

(52) U.S. Cl.
CPC ............ *G11C 16/10* (2013.01); *G11C 16/0483* (2013.01); *G11C 16/3427* (2013.01); *G11C 29/021* (2013.01); *G11C 29/028* (2013.01)

(58) Field of Classification Search
CPC .... G11C 16/10; G11C 16/0483; G11C 16/06; G11C 16/26; G11C 29/028; G11C 29/021; G11C 16/3427
See application file for complete search history.

(56) References Cited

U.S. PATENT DOCUMENTS

| 5,070,032 | A | 12/1991 | Yuan et al. |
| 5,095,344 | A | 3/1992 | Harari |
| 5,313,421 | A | 5/1994 | Guterman et al. |
| 5,315,541 | A | 5/1994 | Harari et al. |
| 5,343,063 | A | 8/1994 | Yuan et al. |
| 5,570,315 | A | 10/1996 | Tanaka et al. |
| 5,661,053 | A | 8/1997 | Yuan |
| 5,768,192 | A | 6/1998 | Eitan |
| 5,903,495 | A | 5/1999 | Takeuchi et al. |
| 6,011,725 | A | 1/2000 | Eitan |
| 6,046,935 | A | 4/2000 | Takeuchi et al. |

(Continued)

FOREIGN PATENT DOCUMENTS

| WO | WO 2011019602 | 2/2011 |
| WO | WO 2012039511 | 3/2012 |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — J. H. Hur
(74) *Attorney, Agent, or Firm* — Davis Wright Tremaine LLP

(57) ABSTRACT

In a nonvolatile memory array in which a NAND string includes a back gate that has a charge storage element, the threshold voltage of the back gate is monitored, and if the threshold voltage deviates from a desired threshold voltage range, charge is added to, or removed from the charge storage element to return the threshold voltage to the desired threshold voltage range.

20 Claims, 14 Drawing Sheets

(56) References Cited

U.S. PATENT DOCUMENTS

| | | | |
|---|---|---|---|
| 6,222,762 | B1 | 4/2001 | Guterman et al. |
| 7,518,919 | B2 | 4/2009 | Gonzalez et al. |
| 7,839,685 | B2 | 11/2010 | Auclair et al. |
| 2005/0122779 | A1 | 6/2005 | Fasoli et al. |
| 2007/0263439 | A1 | 11/2007 | Cornwell et al. |
| 2009/0168533 | A1 | 7/2009 | Park et al. |
| 2009/0204824 | A1 | 8/2009 | Lin et al. |
| 2009/0268524 | A1 | 10/2009 | Maejima |
| 2010/0097858 | A1* | 4/2010 | Tokiwa et al. ........... 365/185.05 |
| 2010/0322000 | A1 | 12/2010 | Shim et al. |
| 2011/0131473 | A1 | 6/2011 | Mokhlesi et al. |
| 2011/0149651 | A1 | 6/2011 | Gorobets et al. |
| 2011/0182119 | A1 | 7/2011 | Strasser et al. |
| 2011/0188307 | A1* | 8/2011 | Kito et al. ................ 365/185.02 |
| 2012/0051137 | A1 | 3/2012 | Hung et al. |
| 2012/0176836 | A1 | 7/2012 | Iguchi et al. |
| 2012/0220088 | A1 | 8/2012 | Alsmeier |
| 2012/0243326 | A1* | 9/2012 | Maeda .................... 365/185.21 |
| 2012/0320678 | A1 | 12/2012 | Maejima et al. |
| 2013/0055012 | A1 | 2/2013 | Roh |
| 2013/0058165 | A1 | 3/2013 | Maejima et al. |
| 2013/0070528 | A1 | 3/2013 | Maeda |
| 2013/0073924 | A1 | 3/2013 | D'Abreu et al. |
| 2013/0107268 | A1 | 5/2013 | Boccara et al. |
| 2013/0201760 | A1 | 8/2013 | Dong et al. |
| 2015/0003161 | A1 | 1/2015 | Avila et al. |
| 2015/0085574 | A1* | 3/2015 | Raghu et al. ............. 365/185.11 |

OTHER PUBLICATIONS

Technical Search Report, Patent Examiner Frederik Wahlin, May 16, 2013, 8 pages.

Non-Final Office Action issued in U.S. Appl. No. 14/033,100, mailed on Aug. 13, 2015, 10 pages.

Non-final Office Action issued in U.S. Appl. No. 14/033,100, mailed on Mar. 4, 2015, 9 pages.

* cited by examiner

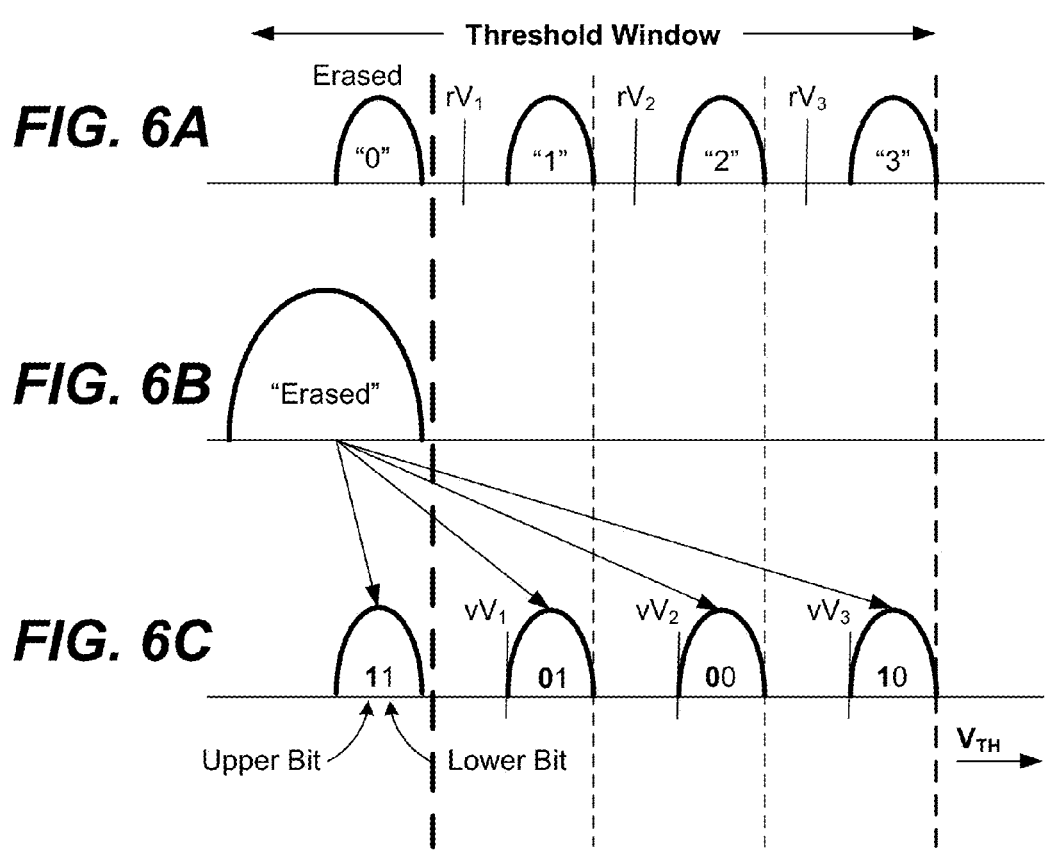
Programming into four states represented by a 2-bit code

SYSTEM FOR MAINTAINING BACK GATE THRESHOLD VOLTAGE IN THREE DIMENSIONAL NAND MEMORY

BACKGROUND

This application relates to the operation of re-programmable non-volatile memory systems such as semiconductor flash memory which record data using charge stored in charge storage elements of memory cells.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

SUMMARY OF THE INVENTION

Examples of the present invention relate to schemes to monitor back gate transistors in three-dimensional NAND strings and to return their threshold voltages to desired ranges if they deviate from those ranges. In certain 3-dimensional memory arrays, back gates include charge storage elements that may come to contain some charge (even if charge is never deliberately stored there). In order to maintain back gates in a specified range, threshold voltages of back gates may be determined, and charge may be added or removed as needed.

An example of a method of operating a 3-D charge-storage memory array includes: determining a threshold voltage of a back gate transistor that is connected in series with memory cells of a 3-D NAND string; comparing the threshold voltage of the back gate transistor with a desirable range of back gate transistor threshold voltage; and in response to determining that the threshold voltage of the back gate transistor is outside of the desirable range of back gate transistor threshold voltage, performing an operation to change the threshold voltage of the back gate transistor.

The operation to change the threshold voltage may add charge to a charge storage element of the back gate transistor. The operation to change the threshold voltage may remove charge from the charge storage element of the back gate transistor. The operation to change the threshold voltage may first remove charge from a charge storage element of the back gate transistor and then add charge to the charge storage element of the back gate transistor. The determining, the comparing, and the performing may be steps in an initialization for the 3-D charge-storage memory array. The determining, the comparing, and the performing may be steps performed in response to a triggering event after the 3-D charge storage memory array has been used for a period of time. The triggering event may be either: (a) the period of time exceeds a predetermined threshold, (b) the back gate transistor experiences wear that exceeds a predetermined amount, or (c) Error Correction Code (ECC) results indicate increased errors. The triggering event may occur during programming of memory cells that are connected in series with the back gate transistor. The triggering event may also trigger determining a threshold voltage of a select transistor that is connected in series with the memory cells of the 3-D NAND string. The triggering event may also trigger determining a threshold voltage of a dummy transistor that is connected in series with the memory cells of the 3-D NAND string.

An example of a 3-D charge-storage memory array includes: a NAND string that comprises two wings that each extend in a direction perpendicular to a surface of a substrate, each wing containing nonvolatile memory cells connected in series, the two wings connected by a back gate transistor; a back gate control circuit that controls a voltage applied to the back gate transistor; and resolving circuits that are configured to resolve a threshold voltage of the back gate transistor.

The 3-D charge-storage memory array may further include charge-increasing circuits that are configured to increase a charge in the back gate transistor and increase the threshold voltage of the back gate transistor, and charge-decreasing circuits that are configured to decrease a charge in the back gate transistor and decrease the threshold voltage of the back gate transistor. The 3-D charge-storage memory array may further include comparing circuits configured to compare the threshold voltage of the back gate transistor with a desirable range of back gate transistor threshold voltage. The 3-D charge-storage memory array may further include a select transistor that selectively connects the NAND string to an external terminal and a select transistor control circuit that applies a control voltage to a gate of the select transistor. The 3-D charge storage memory array may further include at least one dummy nonvolatile memory cell that is not used to store user data, and a dummy nonvolatile memory cell control circuit that controls a voltage supplied to the dummy nonvolatile memory cell.

An example of a 3-D charge-storage memory array includes a plurality of NAND strings that individually include two wings that each extend in a direction perpendicular to a surface of a substrate, the two wings connected by a back gate transistor; a back gate that forms a common gate terminal for all back gate transistors of a block; a back gate control circuit that controls a voltage applied to the back gate; a resolving circuit that is configured to resolve threshold voltages of back gate transistors; and a threshold voltage modification circuit that is configured to modify threshold voltages of back gate transistors.

The threshold voltage modification circuit may include a threshold voltage increasing circuit that adds charge to charge storage elements in back gates and a threshold voltage decreasing circuit that removes charge from charge storage elements in back gates. The 3-D charge storage memory array may further include a triggering circuit that triggers the resolving circuit to resolve the threshold voltages of back gate transistors in response to a triggering event.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 6A-6C illustrate an example of programming a population of memory cells.

DETAILED DESCRIPTION

Memory System

Figure 1:
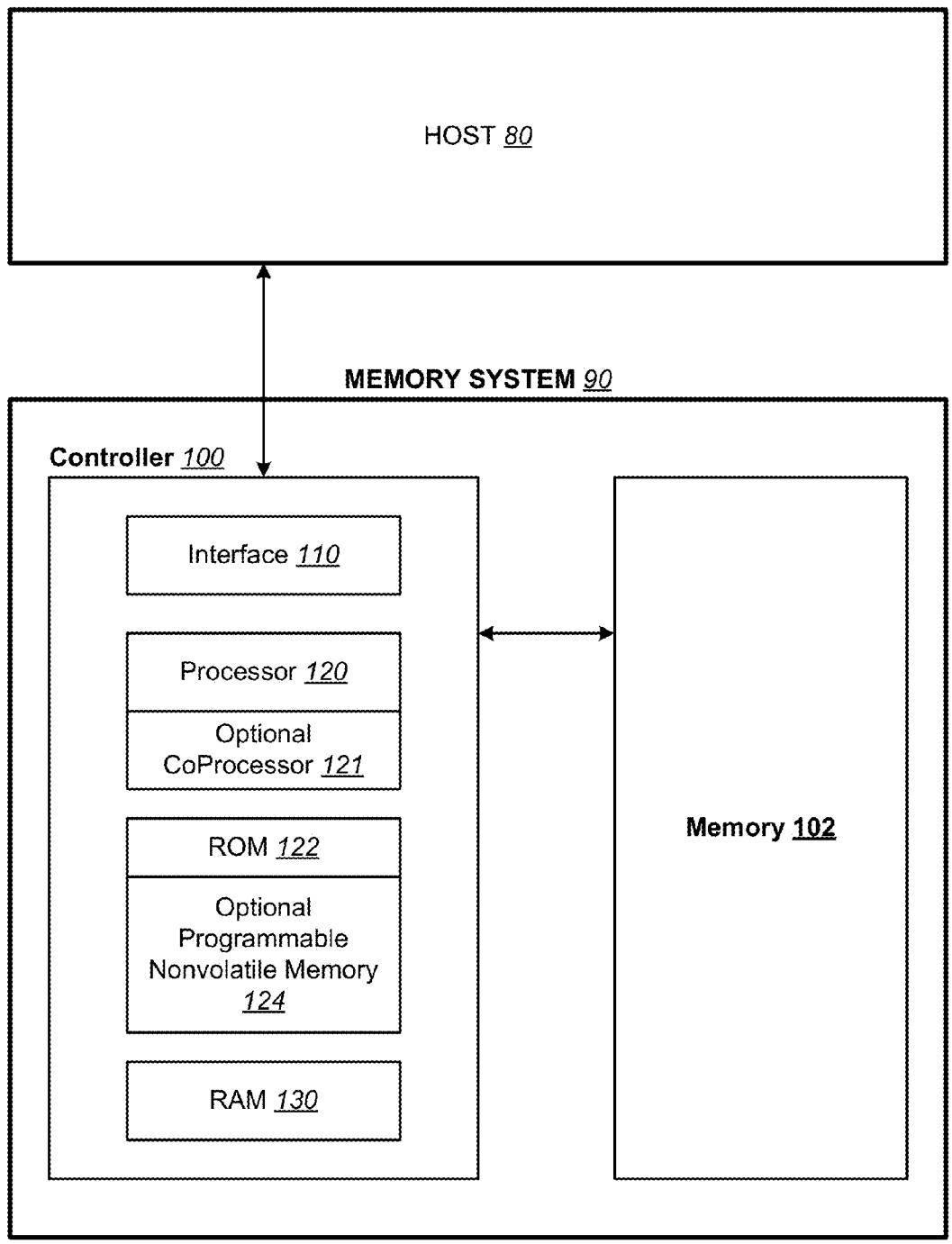
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

Physical Memory Structure

Figure 2:
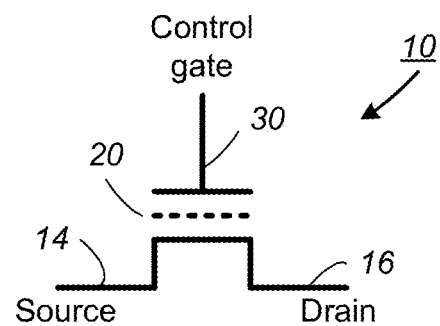
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661, 053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
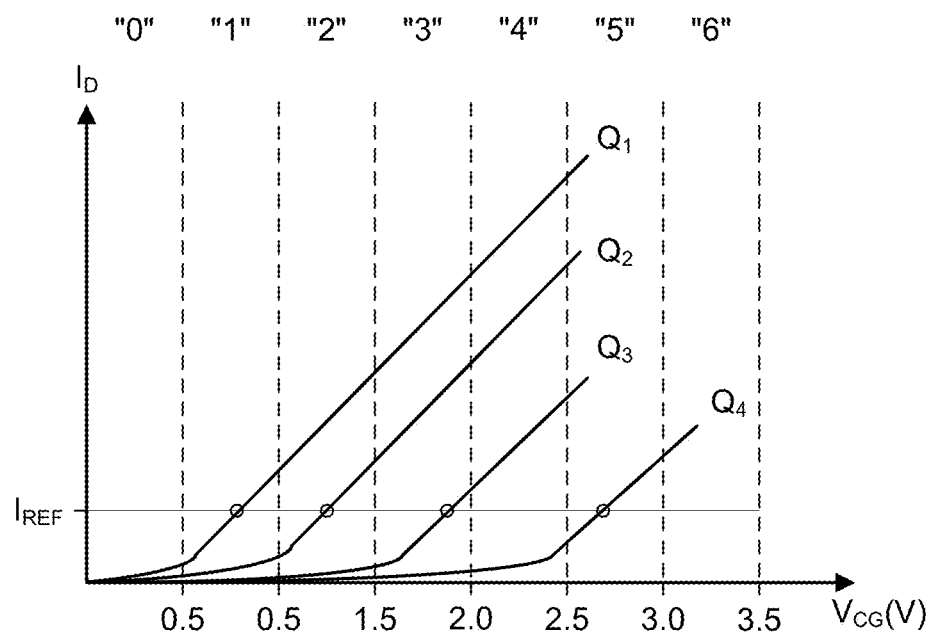
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 μA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
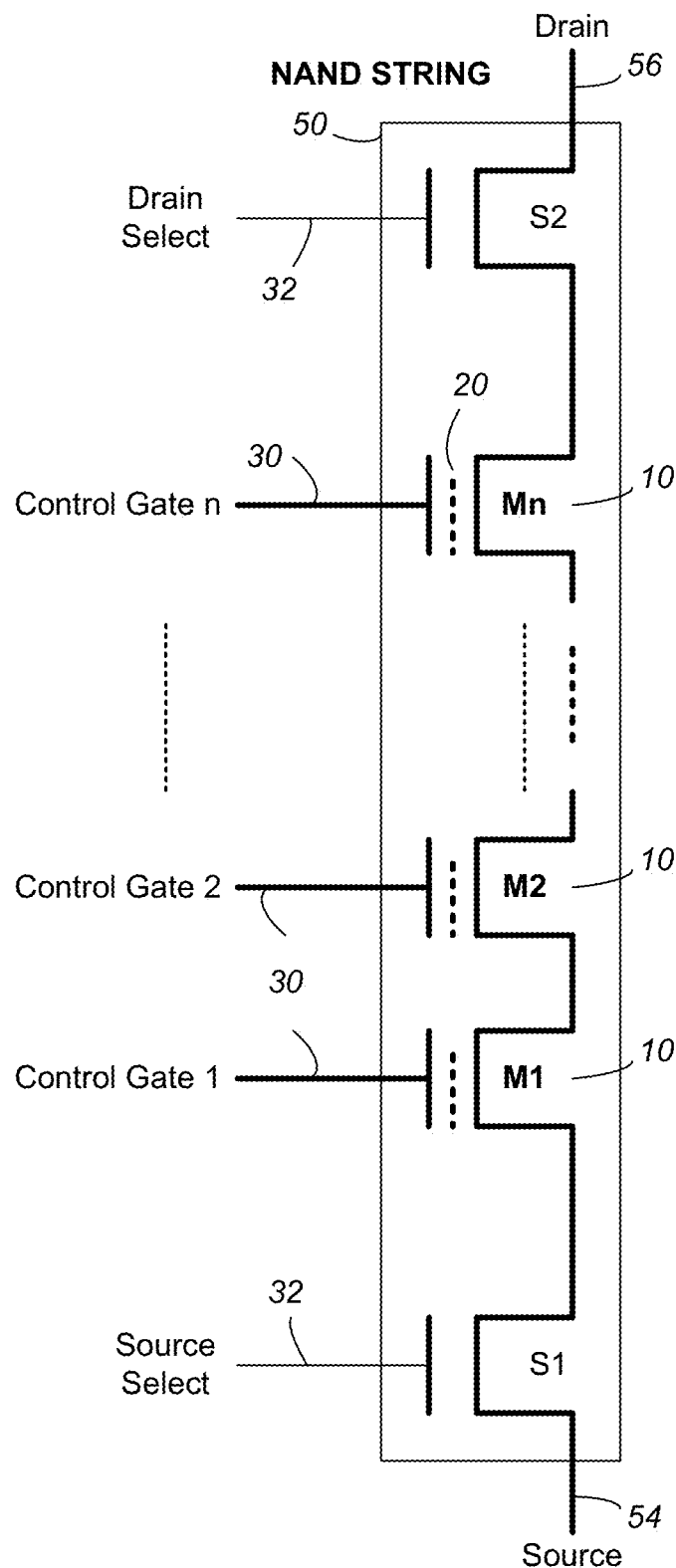
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
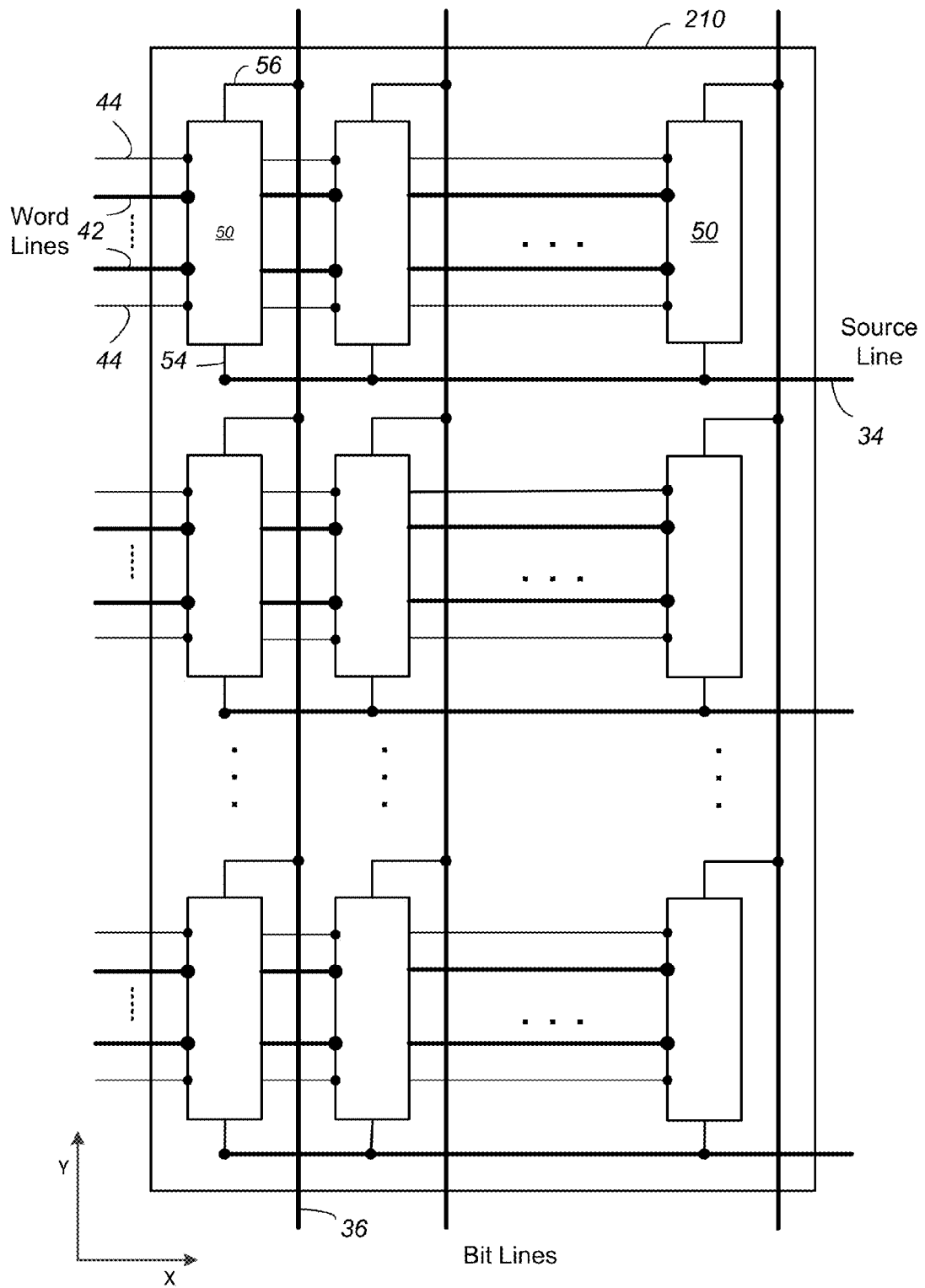
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
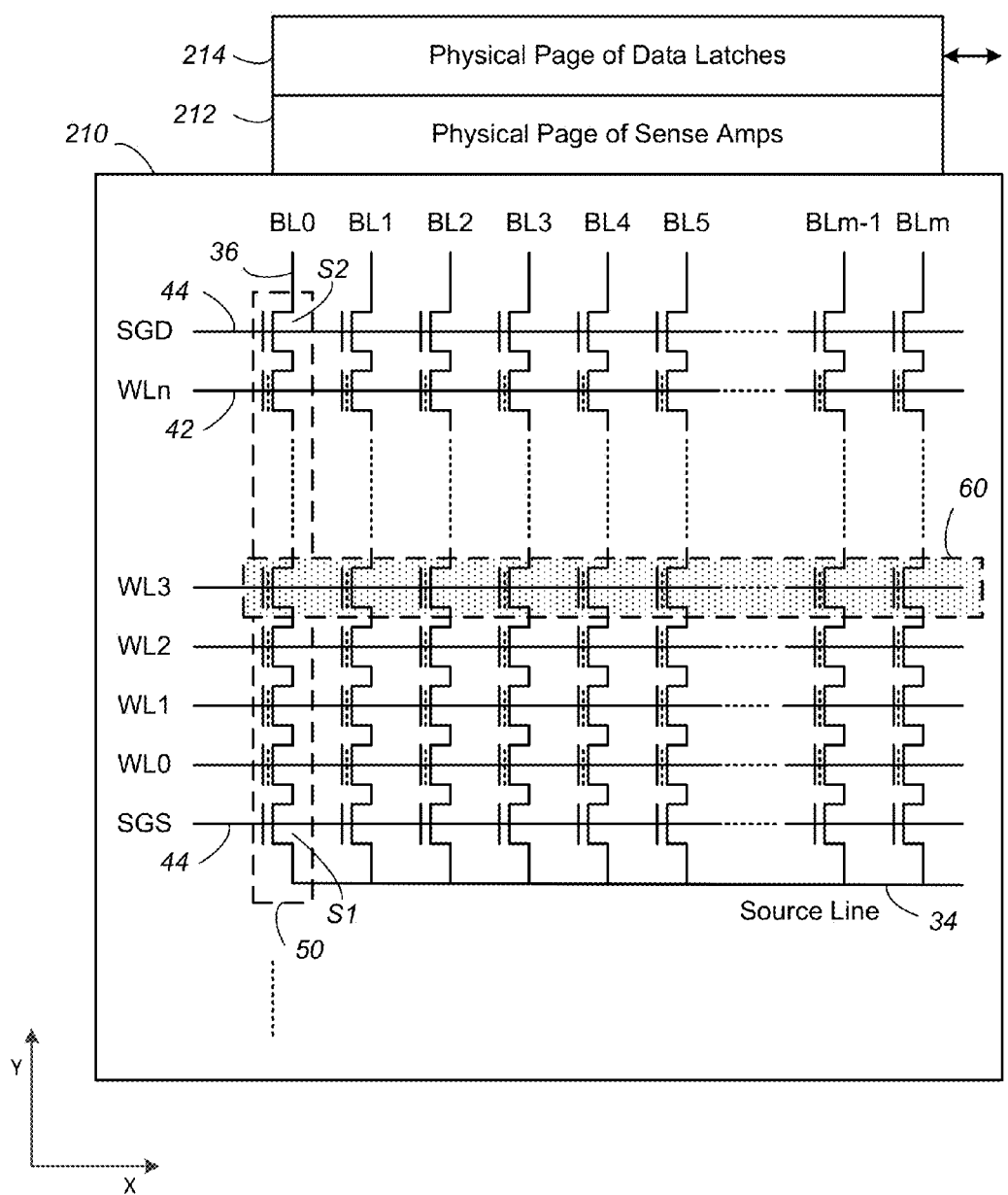
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

FIG. 6A-6C illustrate an example of programming a population of 4-state memory cells. FIG. 6A illustrates the population of memory cells programmable into four distinct distributions of threshold voltages respectively representing memory states "0", "1", "2" and "3". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Patent Publication Number 2012/0220088 and in U.S. Patent Publication Number 2013/0107628, which are hereby incorporated by reference in their entirety.

Figure 7:
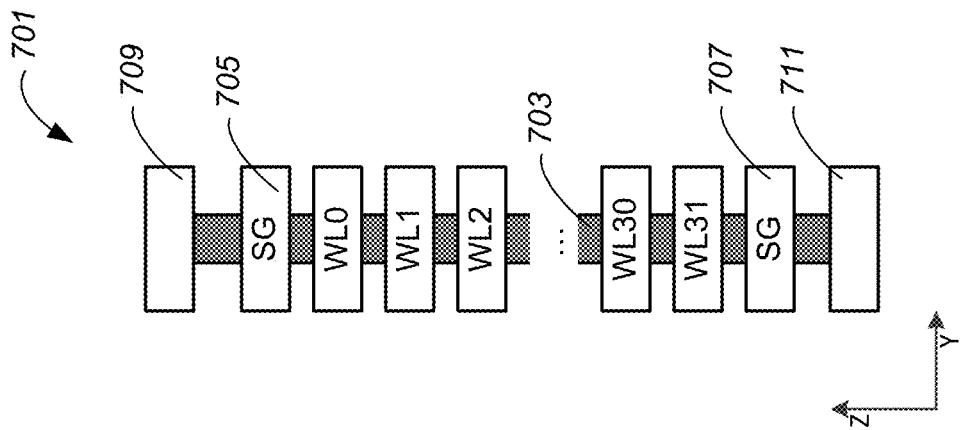
FIG. 7 shows an example of a physical structure of a 3-D NAND string.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

Figure 8:
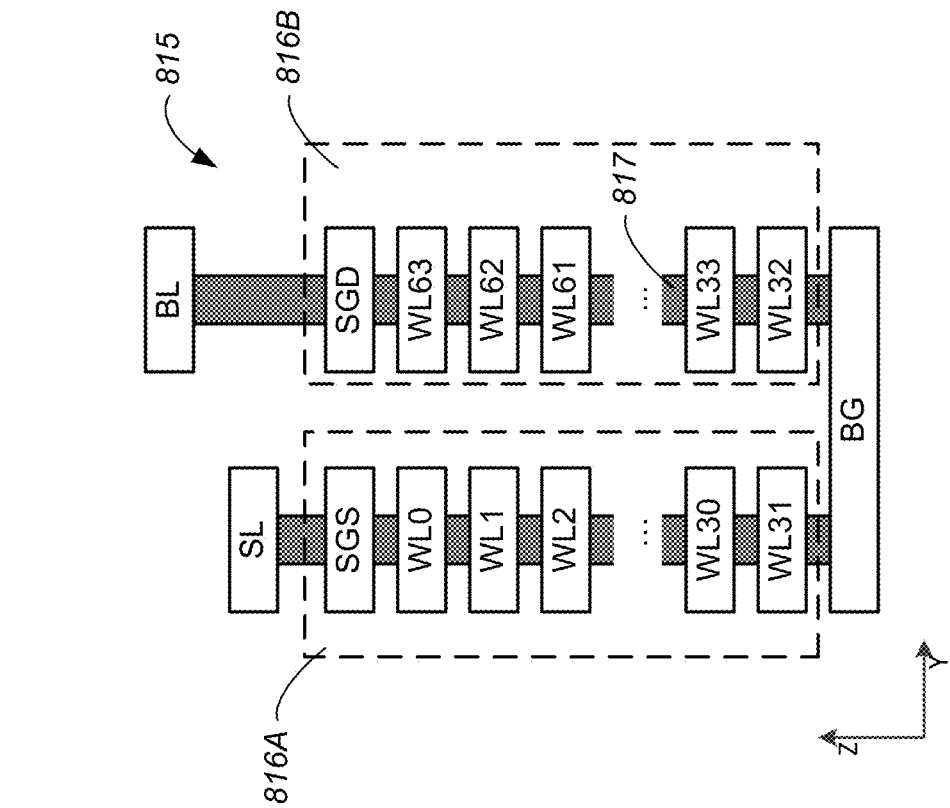
FIG. 8 shows an example of a physical structure of a U-shaped 3-D NAND string.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816E of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9A:
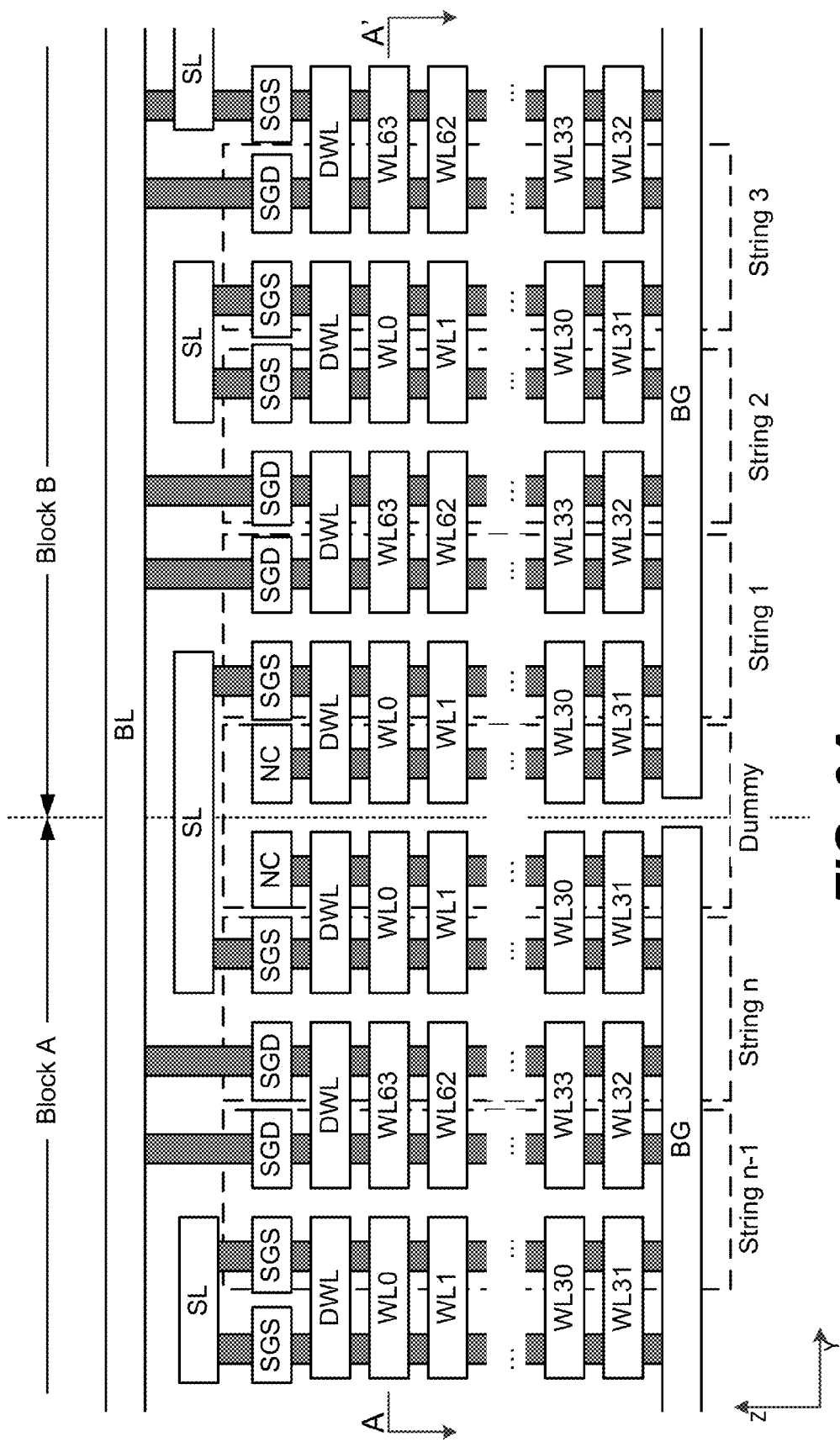
FIG. 9A shows a cross section of a 3-D NAND memory array in the y-z plane.

Vertical NAND strings may be arranged to form a 3-D NAND array in various ways. FIG. 9A shows an example where multiple U-shaped NAND strings in a block are connected to a bit line. In this case, there are n strings (Sting 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

FIG. 9A shows where two blocks meet. Block A contains n strings connected to the bit line BL. While only strings n, and n-1 of Block A are shown, it will be understood that the repetitive structure continues to the left where strings 1 to n-2 are located. Block B contains n strings connected to bit line BL. While only strings 1-3 of Block B are shown, it will be understood that the repetitive structure continues to the right where strings 4 to n are located. It will also be understood that the cross section shown is along one of many bit lines that serve the block and that there are many similar bit lines extending along the y-direction, separated from each other in the x-direction (e.g. behind the plane of the cross section shown). Word lines extend in the x-direction, perpendicular to the plane of FIG. 9A, to connect sets of strings of different bit lines. Similarly, select lines extend in the x-direction so that a set of strings may be selectively connected, or isolated, as a unit. In the example shown, word lines are formed so that a single conductive strip forms a word line of two adjacent strings. Thus, for example, in Block B, string 1 and string 2 have word lines WL32-WL63 that are formed by common conductive strips. In contrast, select lines are not shared between neighboring strings. This allows separate selection of an individual set of strings within a block, even though the selected set of strings may include word lines that are not separately controllable from word lines of unselected strings.

FIG. 9A shows dummy word lines "DWL" separating select lines SGD, SGS, from host data word lines WL0-WL63. While host data word lines are used to store host data (i.e. data that may be sent to the memory from an external source with the expectation that the data will be returned in response to a read command), dummy word lines do not store host data. They may store nothing, or may store some dummy data that puts the dummy cells in a desirable condition (e.g. puts their threshold voltages at levels that make accessing other cells easier, or reduces risk of disturbance). The dummy word lines shown provide some protection for stored data. In particular, the word line closest to the select gate may be vulnerable to data disturbance because of its proximity to the select gate. By making this word line a dummy word line, the danger of disturbing host data is reduced. In some cases, two or more dummy word lines may be provided between a select line and host data word lines because the risk of disturbance extends more than one word line from the select line. Dummy word lines may be located at other locations besides the single location shown. One or more dummy word lines may be located between host data word lines and the back gate ("BG") for example. Dummy word lines generally have the same physical structure as host data word lines so that the number and location of dummy word lines may be configurable for any given array structure.

Where Block A and Block B meet, there are dummy memory cells in both blocks (i.e. between String n of Block A and String 1 of Block B). A wing of a NAND string of dummy cells is provided in each block in this example so that host data word lines of the two blocks are separated by two dummy word lines. This is to reduce disturbance that might occur if host data word lines of different blocks were immediately adjacent to each other. Dummy select lines, which are not connected to control circuits (marked "NC" for "not connected") are also provided where neighboring blocks meet in this example. Different arrangements of dummy word lines, and other dummy structures between blocks are possible according to memory design and operating requirements. For example, select lines may be connected, back gates of neighboring blocks may be in closer proximity than shown, dummy word lines may be connected in different ways, etc.

Each block has a separate back gate, BG, so that back gate transistors of different blocks may be separately controlled. Back gates extend in the x-direction, perpendicular to the cross section of FIG. 9A, so that all back gate transistors of a block are controlled by a common back gate in this example. Control circuits are connected to the back gates of each block so that appropriate bias may be applied to back gates. The structure of back gates is further explained below.

Figure 9B:
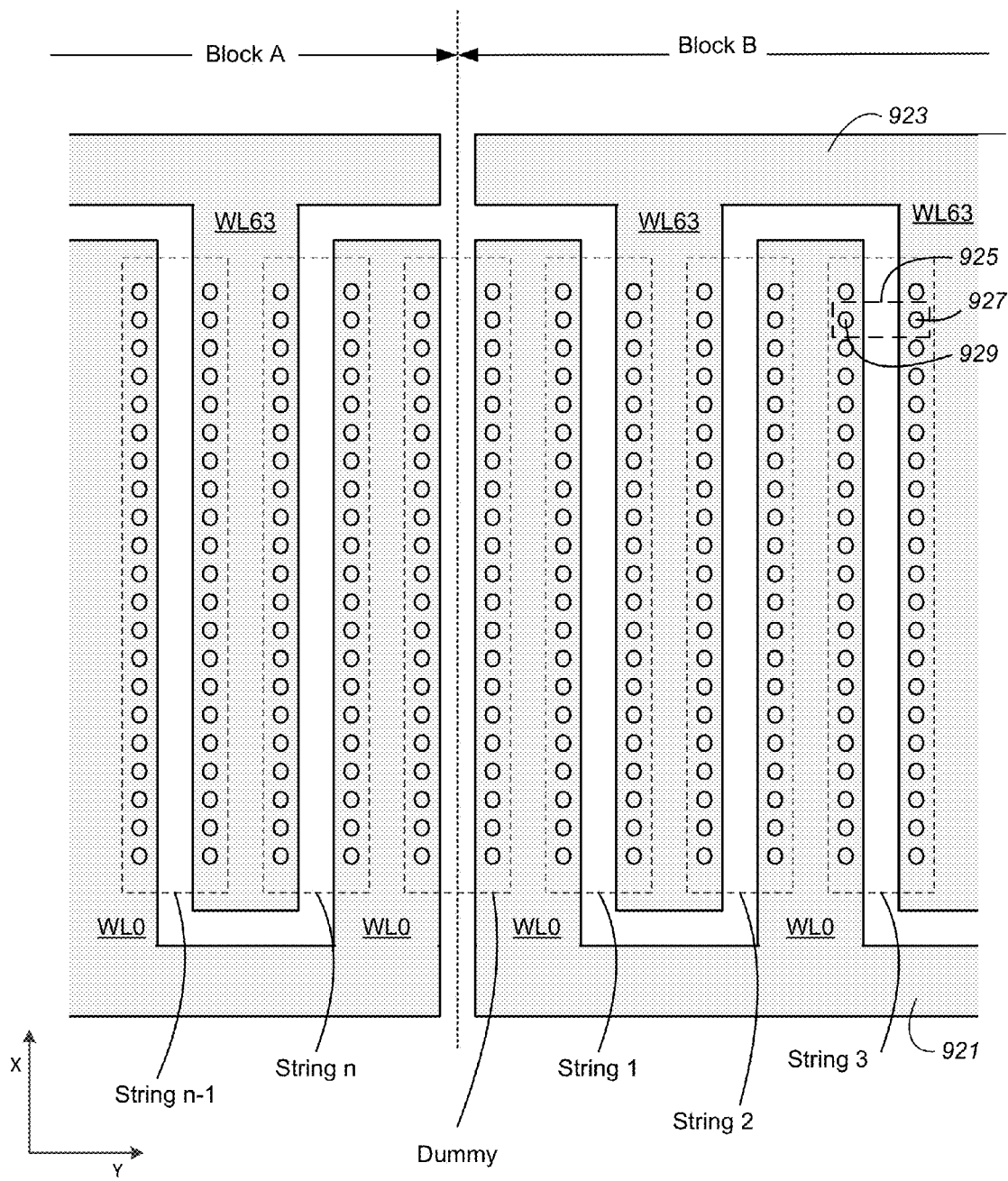
FIG. 9B shows a cross section of the 3-D NAND memory array of FIG. 9A along the x-y plane.

The 3-D NAND memory array of FIG. 9A is further illustrated in FIG. 9B, which shows a cross section along A-A' of FIG. 9A (i.e. along the x-y plane that intersects WL0 and WL63). It can be seen that word lines of a block are formed of strips of conductive material that are connected together. Thus, all word lines marked WL0 in different strings of a block are electrically connected together and are formed from a single electrically conductive body 921. Similarly, all word lines marked WL63 in different strings of a block are electrically connected together and are formed from a single electrically conductive body 923. The two bodies that form word lines of a block on a given level appear as interdigitated fingers extending from opposite sides of the block. These two bodies may be separated by Shallow Trench Isolation (STI) dielectric, or by any suitable insulator. A similar pattern may be found at each level of word lines (e.g. WL1 and WL62 are similarly interdigitated, as are WL2 and WL61, and so on). Word lines of different blocks are isolated from each other.

Thus, WL0 of Block A is separate, and electrically isolated from WL0 of Block B. Similarly, WL63 of Block A is separate, and electrically isolated from WL0 of Block B.

Memory holes are shown as circles (memory holes are cylindrical in shape and extend in the z-direction, perpendicular to the cross section shown). A U-shaped NAND string 925 extends along two memory holes 927, 929, with one memory hole 927 passing through body 923 and the other memory hole 929 passing through body 921. A set of strings consists of all such strings that are aligned along the x-direction and that share select lines (which also extend along the y-direction). For example, one such set is made up of all strings indicated by "String 3" in Block B, including string 925. When a given set of strings within a block is selected, a selected word line (or portion of a word line, i.e. a subset of the bit lines that intersect the word line) may be read by applying appropriate word line voltages to the selected word line and to unselected word lines. A Back Gate (not shown in FIG. 9B) extends under the word lines of Block B to control all BG transistors of all strings in the block. When an appropriate bias is applied to the BG of Block B, the back gate transistor of string 925 and back gate transistors of all other similar strings indicated by "String 3" turn on to enable accessing of memory cells of String 3

Figure 10A:
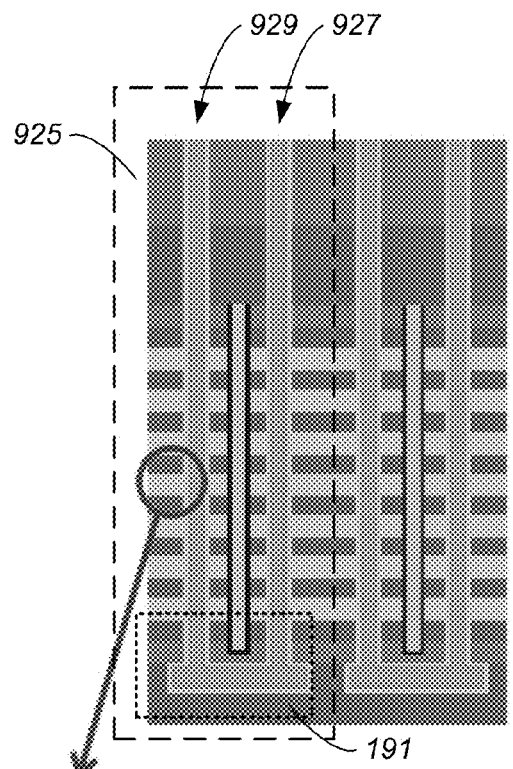
FIGS. 10A-10C show examples of structures of NAND strings.

FIG. 10A shows a cross section along a y-z plane that intersects memory holes 927, and 929 of NAND string 925 so that the structures formed within memory holes may be clearly seen. FIG. 10A shows that memory holes 927 and 929 are connected together at the bottom so that the two wings may be electrically connected in series.

Figure 10B:
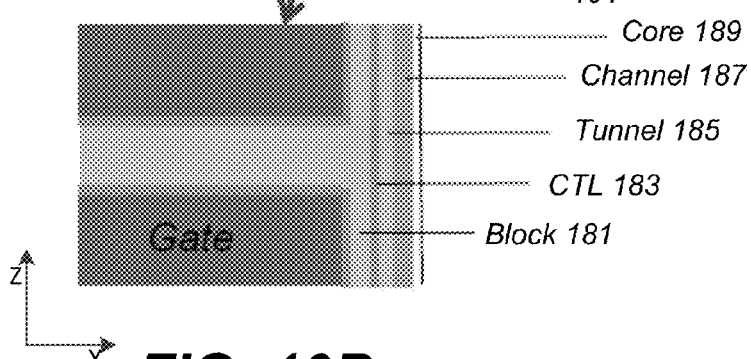

FIG. 10B shows the structure of a stack of layers in the memory hole 929 where memory cells are formed. It can be seen that a blocking dielectric "Block" 181 is deposited on the walls of the memory hole to provide electrical isolation. A Charge Trapping Layer (CTL) 183 is deposited on the blocking dielectric 181. The CTL layer 183 forms charge storage elements where the CTL is in close proximity to polysilicon word lines. A tunnel dielectric 185 is deposited to provide electrical isolation and to allow charge to tunnel into the CTL layer 183 under certain conditions. A channel layer 187 is deposited to form the channel of the memory cells along the string. A core material 189 is deposited that forms the core of the column that is located in the memory hole.

When a NAND string is made using a memory hole, layers are deposited within the cylindrical memory hole so that the memory hole is filled in a substantially uniform manner with all deposited layers being present in at all levels (though some variation in memory hole diameter and other dimensions may occur). In contrast to planar NAND, where films deposited on a substrate surface can be patterned by photolithography, films deposited within a memory hole are generally not exposed in a manner that allows such patterning. As a result, charge storage elements formed by a charge trapping layer may be present in select transistors. To deal with this, select transistors may be managed in a way that maintains their characteristics within desirable ranges. Examples of such management are described in U.S. patent application Ser. No. 13/801,800, filed on Mar. 13, 2013.

Back Gates

Back gate transistors are typically formed by depositing the same layers that fill memory holes in a tube that extends between memory holes of a NAND string. The tube may be formed using a sacrificial material that is etched away by a selective etch. The tube may be formed in a layer of the substrate that is appropriately doped, or within a layer of conductive material that overlies the substrate, so that the material enclosing the tube forms an electrically conductive gate of the back gate transistor. The layer of conductive material may form a common gate of all back gate transistors of a block. The layer may be patterned so that back gates of neighboring blocks are not connected, i.e. each block contains a portion of the conductive layer that is isolated from portions of other blocks. Each such portion may be separately connected to a peripheral circuit to allow control of back gates on a block by block basis.

Figure 10C:
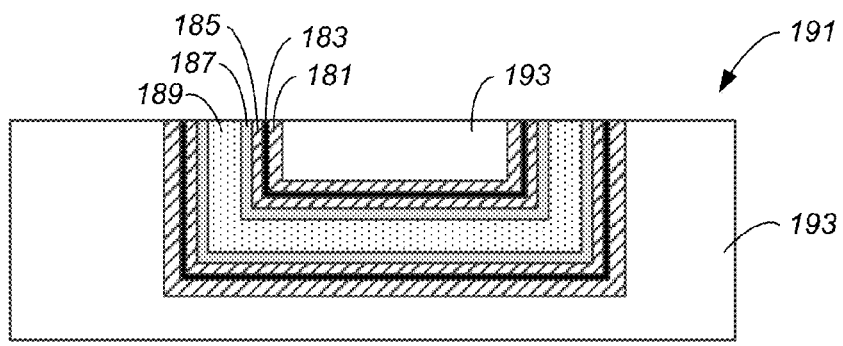

FIG. 10C shows a cross section of a back gate transistor 191 of NAND string 925 including the stack of materials that fill the tube within the back gate layer 193 (the same stack as in memory hole 929). Core material 189 fills the center of the tube, with channel layer 187 surrounding the core material. Tunnel dielectric 185 isolates the channel from a CTL layer 183. The block dielectric 181 separates the CTL layer from the back gate layer 193. It will be understood that while the geometry is different, the stack of layers of FIG. 10C is the same as FIG. 10B and is formed by the same series of process steps. It will be further understood that the stack extends along all inner surfaces of memory holes and connecting tubes i.e. stack is substantially cylindrically symmetric about core material 189. Examples of methods of forming such structures are disclosed in U.S. Patent Publication No. 2012/0220088.

It can be seen from FIG. 10C that back gate transistor 191 formed in the back gate BG contains a charge trapping layer that may acquire charge that may change the threshold voltage of the back gate transistor. While the back gate transistor is not used to store user data and is therefore not subject to programming, reading, or erasing operations, like a memory cell, the charge trapping layer within the back gate transistor may acquire charge as a result of operations directed at memory cells along the NAND string so that its characteristics may change over time.

Figure 11:
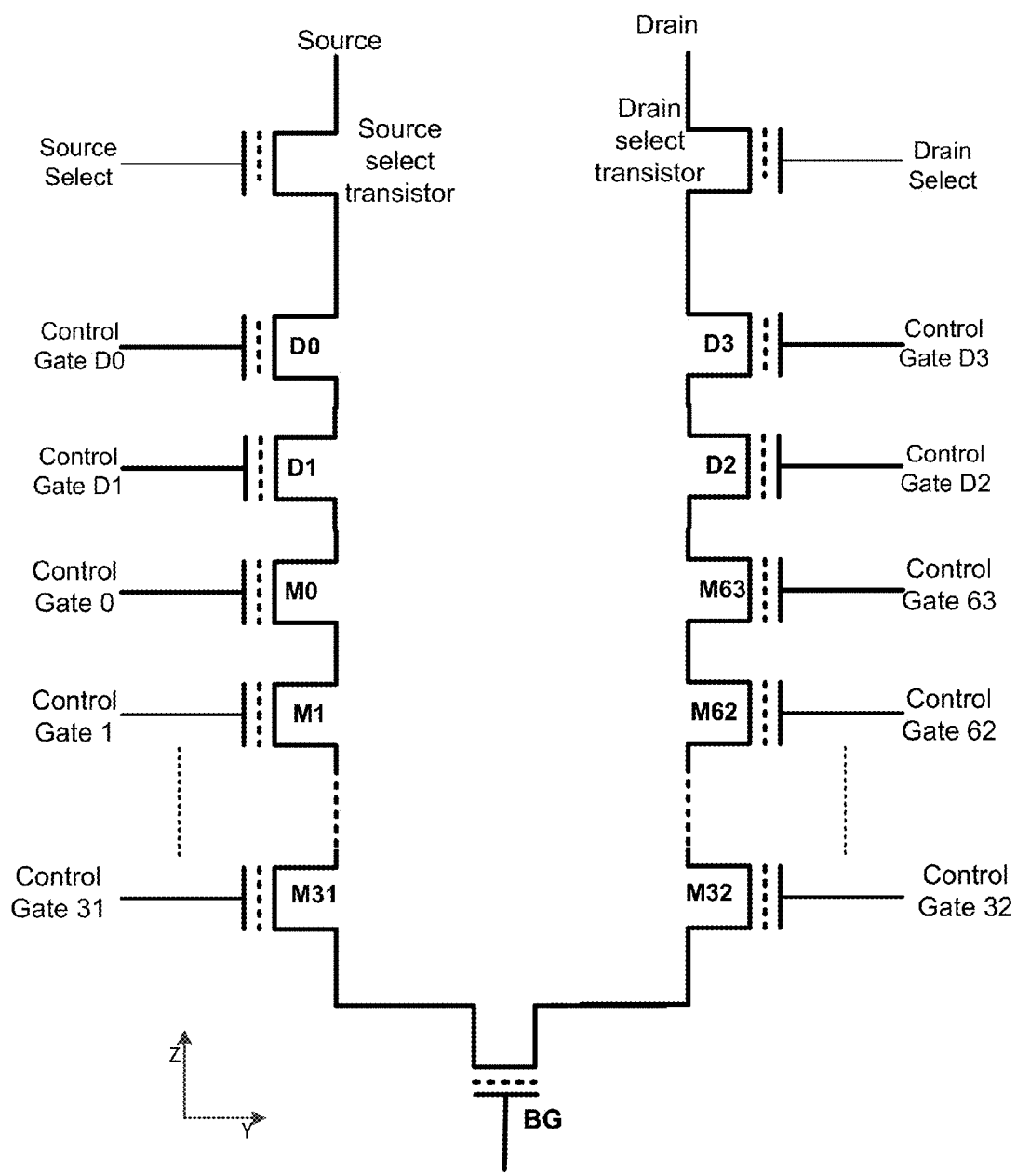
FIG. 11 is a schematic of a NAND string with two wings connected by a back gate.

FIG. 11 shows a schematic of a U-shaped NAND string including a back gate transistor connected in series between the wings of the NAND string to allow the two wings to be electrically connected. The back gate transistor contains a charge storage element (similar to memory cells). Over time, the threshold voltage of the back gate transistor may change and this change may affect operations that access memory cells along the NAND string connected to the back gate transistor. For example, such a back gate transistor may not turn on fully during a read of memory cells along the NAND string causing a large number of bad bits that result in data being uncorrectable by Error Correction Code, or "UECC"). In general, a back gate transistor may have a desirable range of threshold voltage that facilitates access to memory cells that are connected in series with it. Deviation from this desirable range may cause problems.

Figure 12A:
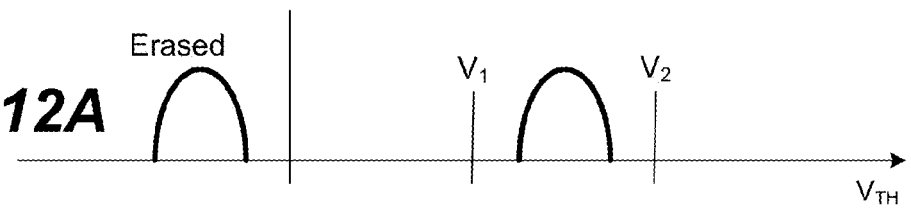
FIG. 12A-D show examples of threshold voltage distributions for back gate transistors.
Figure 12B:
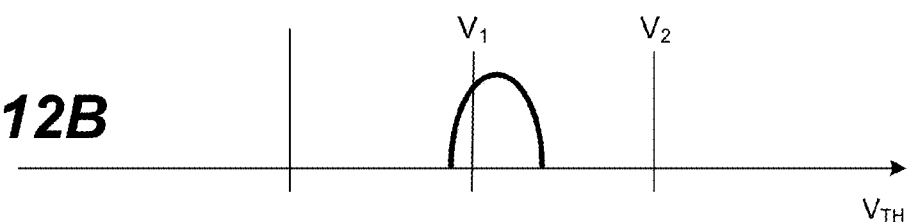
Figure 12C:
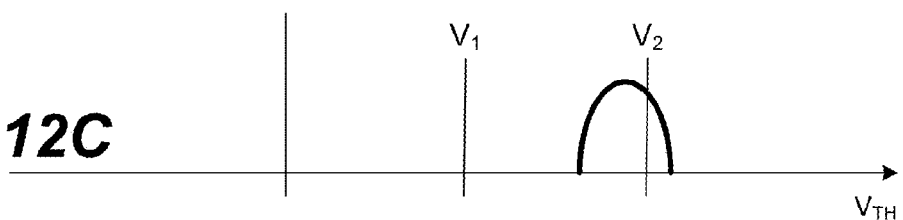
Figure 12D:
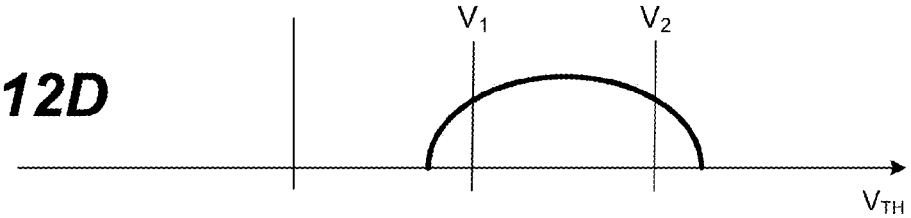

In some cases, the threshold voltage of a back gate transistor may be tuned to a desired range so that it turns on and off when corresponding voltages are applied to the back gate. This means bringing the threshold voltage of the back gate transistor to a desired range that may be similar to one of the ranges shown in FIG. 6, or may be different. FIG. 12A shows an example of a distribution of back gate transistors in a desirable threshold voltage range that is between $V_1$ and $V_2$. If the threshold voltage of a back gate transistor changes significantly from this range then the back gate transistor may not turn on and off as required. If charge in the charge storage element either increases or decreases so that the charge is outside a specified range the back gate transistor may no longer operate as specified. In order to have all strings operating correctly as their gates are driven by predetermined voltages it is necessary to have threshold voltages of back gate transistors (and select transistors) within a certain window (i.e. a reasonably narrow distribution). If back gate transistors lose charge (threshold voltage distribution shifts down) as shown in FIG. 12B or gain charge (threshold voltage distribution shifts up) as shown in FIG. 12C, or if back gate transistors have random changes in charge levels (threshold voltage distribution becomes wider) as shown in FIG. 12D then problems may occur.

In order to maintain the threshold voltage of a back gate transistor within a desired range, the threshold voltage may be monitored to see if it is within a predetermined range and restore it to the predetermined range if it is no longer within the predetermined range. In some cases such monitoring may be performed every time a block is written. For example, where the threshold voltages of back gate transistors are affected by programming of the memory cells connected in series with them, it may be desirable to return the back gate transistors to their desired threshold voltage ranges at the end of programming the block. In other cases, this may occur during programming of the block (e.g. after one wing is programmed in a string).

The threshold voltage may be monitored periodically during the lifecycle of the memory (e.g. based on a time stamp or other time indicator), or may be monitored in response to some triggering event. Hot count (the number of write/erase cycles) may be used to trigger monitoring. For example, back gate transistors may be monitored every N cycles (e.g. every 1000 cycles). Alternatively, monitoring may be performed in response to increasing numbers of ECC errors so that when the number of ECC errors exceeds a threshold number then monitoring is performed. Other triggering events may also be used. Select transistors and dummy memory cells may be similarly monitored and managed. The same triggering events may be used for back gate transistors, select transistors, and dummy memory cells, or different triggering events may be used.

Figure 13:
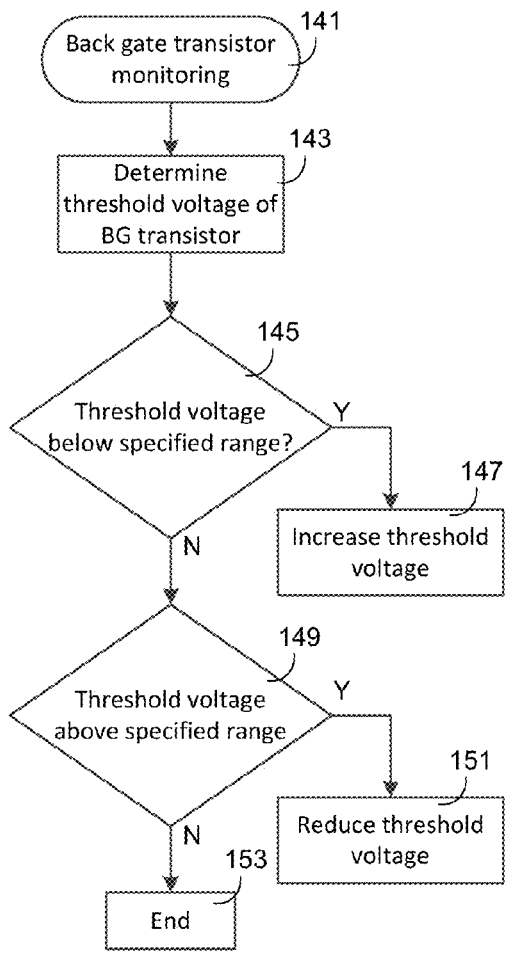
FIG. 13 illustrates a scheme for back gate transistor monitoring.

FIG. 13 shows an example of a scheme to monitor a back gate transistor 141. Initially, the threshold voltage of a back gate transistor is determined 143. This determination may be performed in a similar manner to reading a memory cell (e.g. memory cells are turned on and a sense amplifier is used to sense current or voltage on the bit line while one or more voltages are applied to the back gate that controls the back gate transistor). If the threshold voltage is below the specified range 145 then an operation may be carried out to increase the threshold voltage 147. If the threshold voltage is above the specified range 149 then an operation may be carried out to reduce the threshold voltage 151. If the threshold voltage is within the specified range (neither above nor below the specified range) then the monitoring operation ends 153 and the back gate transistor may continue to be used without change.

Where the desirable threshold voltage range of a back gate transistor is greater than zero (i.e. some charge on the charge storage element is desirable) the threshold voltage may fall below the desired range through current leakage. Such leakage corresponds to similar leakage in memory cells which is related to data retention issues. Loss of charge through such leakage may be counteracted by adding charge in an operation that is analogous to a programming operation applied to a memory cell.

Figure 14:
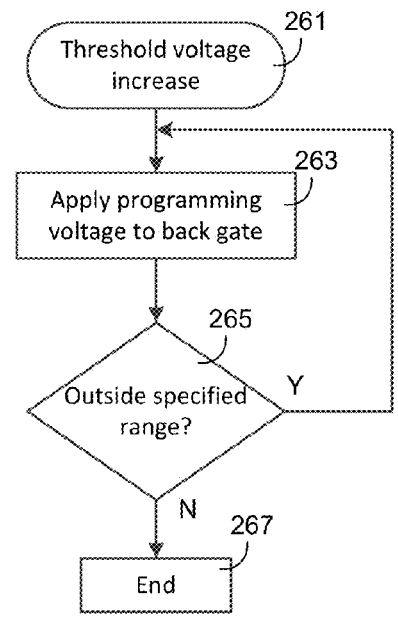
FIG. 14 illustrates a scheme for increasing back gate transistor threshold voltage.

FIG. 14 shows an example of an operation to increase the threshold voltage of a back gate transistor 261 by a series of steps. A programming voltage is supplied to the back gate while the channel is kept at a low voltage 263. The programming may be performed by applying one or more pulses, with different pulses having the same or different voltages. After a given pulse, or series of pulses, a verification step determines if the threshold voltage is outside the specified range 265. If it remains outside the specified range then another pulse, or series of pulses, is applied. If the threshold voltage is within the specified range then the operation ends 267 and the back gate transistor is ready for use.

The operation of FIG. 14 may be used as part of memory configuration or initialization. For example, where the desirable range of threshold voltage is not the threshold voltage of a newly-manufactured back gate transistor then an operation may be performed after manufacturing, prior to use, to bring the threshold voltage within the desired range. Such initial tuning of the back gate transistor threshold voltage may be performed at the factory, or later, after the product is shipped, for example when it is first powered on.

Figure 15:
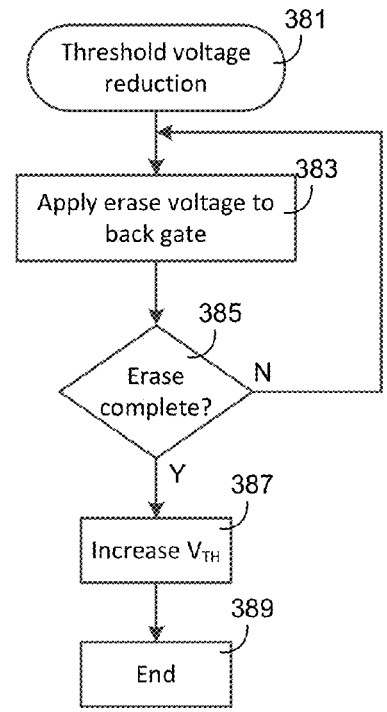
FIG. 15 illustrates a scheme for decreasing back gate transistor threshold voltage.

If the threshold voltage of the back gate transistor is too high then it may be reduced as shown in FIG. 15. A threshold voltage reduction operation 381 may be considered to be analogous to an erase operation applied to a memory cell. An erase voltage is applied to the back gate 383. This may be a low voltage. At the same time a positive voltage is applied to the channel of the NAND string. After this step, a determination is made as to whether the back gate transistor is fully erased 385. The steps are repeated until it is determined to be fully erased. In many cases, the desired threshold voltage range is not the erased state, so that the erase operation is followed by increasing the threshold voltage 387 (e.g. according to FIG. 12) in order to return the threshold voltage to the desired range. In some schemes, tuning always includes erasing prior to increasing the threshold voltage by adding charge. In other schemes, charge may be added without necessarily erasing first. Once the desired threshold voltage range is achieved, the process ends 389.

Monitoring and tuning back gate transistor threshold voltage may be performed on any grouping of back gate transistors. For example, all back gate transistors of a block may be monitored and tuned together. In particular, where all back gate transistors of a block share a common back gate it may be convenient to monitor and tune them together. With different hardware (e.g. more than one back gate per block, or common back gates extending over more than a block) it may be more convenient to perform monitoring and tuning in different units. In some cases, multiple blocks may be treated together as a unit for monitoring and tuning of back gate transistor threshold voltages.

In many cases, patterns of change may be observed in threshold voltages of back gate transistors. For example, all back gate transistors of a block may show an increase, or decrease, in threshold voltage at a reasonably predictable rate. One or more sample transistors may be taken as representative of a group of transistors. Conditions that return the sample transistors to the desired threshold voltage range may be assumed to return other similar transistors to the desired threshold voltage range. Thus, back gate transistors of one or more strings in a block may be considered as a sample that is subject to erase until it is confirmed that back gate transistors along the line have threshold voltages corresponding to an erased condition. Other back gate transistors may be subjected to the same erase conditions without separate erase verification (i.e. it may be assumed that they will be similarly erased by the same conditions). One or more strings may similarly be considered as samples when increasing threshold voltage also, with verification applied to only sample transistors of a particular set of strings, and other transistors simply subjected to the same conditions without necessarily being separately verified.

Figure 16:
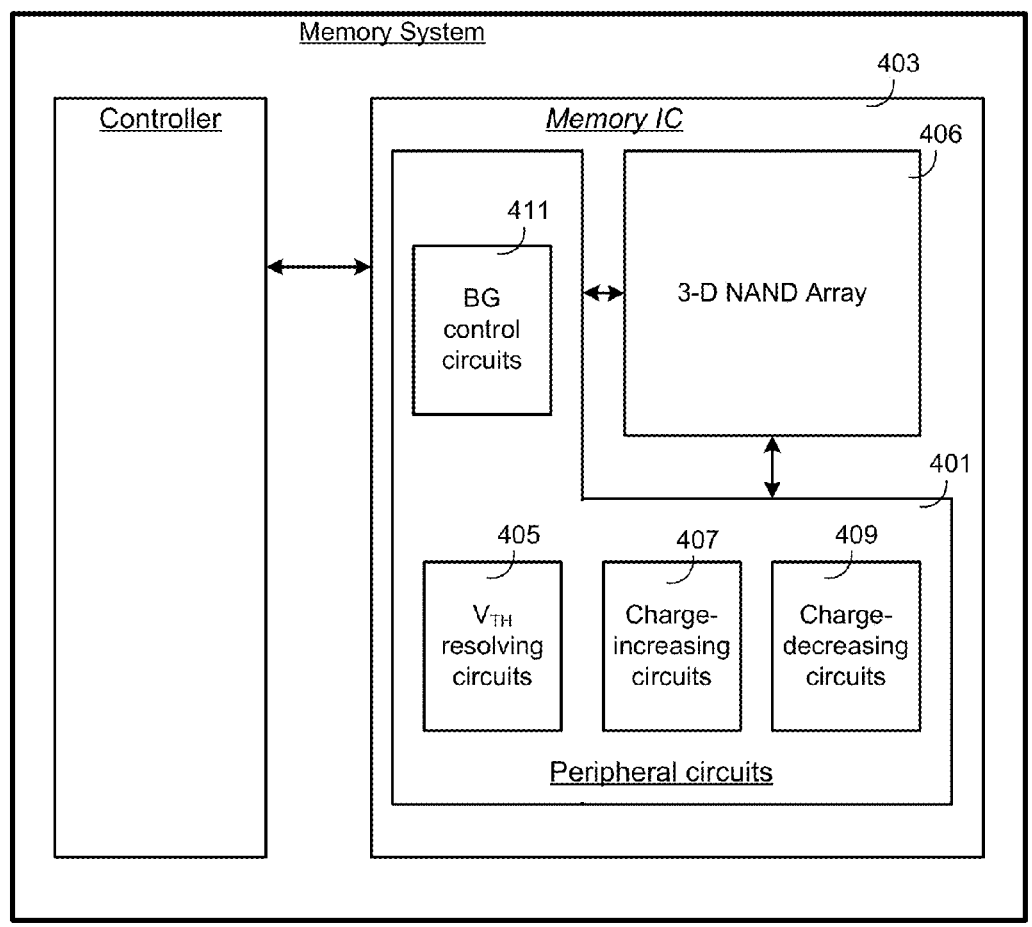
FIG. 16 shows an example of hardware for managing back gate transistors, select transistors, and dummy cells.

Various hardware may be used to carry out aspects of the present invention. FIG. 16 shows one example where peripheral circuits 401 on a memory chip 403 include threshold voltage resolving circuits 405 to resolve the threshold voltages of back gate transistors and/or select transistors and/or dummy cells in a 3-D NAND array 406 (different embodiments may have one or more). Such circuits may be similar in configuration to reading circuits used to read memory cells. Also shown are charge-increasing circuits 407, which also may be for back gate transistors and/or select transistors and/or dummy cells. Charge-increasing circuits may be similar to programming circuits used to program data to memory cells. However, charge-increasing circuits generally add charge uniformly to back gate transistors, select transistors, or dummy cells to bring them to a uniform specified level, whereas programming circuits program memory cells to various levels that reflect data to be stored. Also shown are charge-decreasing circuits 409, which may be for back gate transistors and/or select transistors and/or dummy cells. Charge-decreasing circuits may be similar to erase circuits used to erase memory cells. Charge-increasing circuits and charge-decreasing circuits may be considered as threshold voltage modification circuits. Back gate control circuits 411 are connected to back gates of individual blocks and provide the appropriate voltages to back gates to carry out the operations described above.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of operating a 3-D charge-storage memory array comprising:
   tuning a threshold voltage of a back gate transistor that is connected in series with memory cells of a 3-D NAND string so that the threshold voltage is within a desirable range of back gate transistor threshold voltage;
   subsequently determining the threshold voltage of the back gate transistor;
   comparing the threshold voltage of the back gate transistor with the desirable range of back gate transistor threshold voltage; and
   in response to determining that the threshold voltage of the back gate transistor has drifted outside of the desirable range of back gate transistor threshold voltage, performing an operation to change the threshold voltage of the back gate transistor.

2. The method of claim 1 wherein the operation to change the threshold voltage adds charge to a charge storage element of the back gate transistor.

3. The method of claim 1 wherein the operation to change the threshold voltage removes charge from the charge storage element of the back gate transistor.

4. The method of claim 1 wherein the operation to change the threshold voltage first removes charge from a charge storage element of the back gate transistor and then adds charge to the charge storage element of the back gate transistor.

5. The method of claim 1 wherein the determining, the comparing, and the performing are steps in an initialization for the 3-D charge-storage memory array.

6. The method of claim 1 wherein the determining, the comparing, and the performing are steps performed in response to a triggering event after the 3-D charge storage memory array has been used to store user data for a period of time.

7. The method of claim 6 wherein the triggering event is either: (a) the period of time exceeds a predetermined threshold, (b) the back gate transistor experiences wear that exceeds a predetermined amount, or (c) Error Correction Code (ECC) results indicate increased errors.

8. The method of claim 6 wherein the triggering event occurs during programming of memory cells that are connected in series with the back gate transistor.

9. The method of claim 6 wherein the triggering event also triggers determining a threshold voltage of a select transistor that is connected in series with the memory cells of the 3-D NAND string.

10. The method of claim 6 wherein the triggering event also triggers determining a threshold voltage of a dummy transistor that is connected in series with the memory cells of the 3-D NAND string.

11. A 3-D charge-storage memory comprising:
a NAND string that comprises two wings that each extend in a direction perpendicular to a surface of a substrate, each wing containing nonvolatile memory cells connected in series, the two wings connected by a back gate transistor;
a back gate control circuit that controls a voltage applied to the back gate transistor; and
resolving circuits that are configured to resolve a threshold voltage of the back gate transistor periodically during the lifecycle of the 3-D charge-storage memory.

12. The 3-D charge-storage memory of claim 11 further comprising charge-increasing circuits that are configured to increase a charge in the back gate transistor and increase the threshold voltage of the back gate transistor.

13. The 3-D charge-storage memory of claim 11 further comprising charge-decreasing circuits that are configured to decrease a charge in the back gate transistor and decrease the threshold voltage of the back gate transistor.

14. The 3-D charge-storage memory of claim 11 further comprising comparing circuits configured to compare the threshold voltage of the back gate transistor with a desirable range of back gate transistor threshold voltage.

15. The 3-D charge-storage memory of claim 11 further comprising a select transistor that selectively connects the NAND string to an external terminal and a select transistor control circuit that applies a control voltage to a gate of the select transistor.

16. The 3-D charge storage memory of claim 11 further comprising at least one dummy nonvolatile memory cell that is not used to store user data, and a dummy nonvolatile memory cell control circuit that controls a voltage supplied to the dummy nonvolatile memory cell.

17. A 3-D charge-storage memory comprising:
a plurality of NAND strings that individually include two wings that each extend in a direction perpendicular to a surface of a substrate, the two wings connected by a back gate transistor that is initialized to an initial threshold voltage range;
a back gate that forms a common gate terminal for all back gate transistors of a block;
a back gate control circuit that controls a voltage applied to the back gate;
a resolving circuit that is configured to resolve threshold voltages of back gate transistors; and
a threshold voltage modification circuit that is configured to modify threshold voltages of back gate transistors to return the threshold voltages of back gate transistors to the initial threshold voltage range when the resolving circuit indicates that the threshold voltages have drifted outside the initial threshold voltage range.

18. The 3-D charge-storage memory of claim 17 wherein the threshold voltage modification circuit includes a threshold voltage increasing circuit that adds charge to charge storage elements in back gates and a threshold voltage decreasing circuit that removes charge from charge storage elements in back gates.

19. The 3-D charge storage memory of claim 17 further comprising a triggering circuit that triggers the resolving circuit to resolve the threshold voltages of back gate transistors in response to a triggering event.

20. The 3-D charge storage memory of claim 19 wherein the triggering event is: (a) the period of time exceeds a predetermined threshold, (b) the back gate transistor experiences wear that exceeds a predetermined amount, or (c) Error Correction Code (ECC) results indicate increased errors.

* * * * *